United States Patent [19]

Uchiyama et al.

[11] 4,394,211

[45] Jul. 19, 1983

[54] METHOD OF MANUFACTURING A SEMICONDUCTOR DEVICE HAVING A LAYER OF POLYMIDE RESIN

[75] Inventors: Nobuhiro Uchiyama, Yokohama; Masataka Shingu, Kawasaki; Saburo Tsukada, Tokyo, all of Japan

[73] Assignee: Fujitsu Limited, Kawasaki, Japan

[21] Appl. No.: 415,929

[22] Filed: Sep. 8, 1982

[51] Int. Cl.³ .................. B44C 1/22; C03C 15/00; C03C 25/06; B29C 17/08
[52] U.S. Cl. ............................. 156/628; 156/655; 156/668; 156/904; 427/90
[58] Field of Search ............. 427/38, 41, 43.1, 88–91; 156/628, 654, 655, 656, 668, 659.1, 904; 430/296; 148/1.5, 187

[56] References Cited

U.S. PATENT DOCUMENTS 4,068,018   1/1978   Hashimoto et al. ........... 427/43.1 X

*Primary Examiner*—William A. Powell
*Attorney, Agent, or Firm*—Staas & Halsey

[57] ABSTRACT

In order to selectively reduce the etching rate of the polyimide resin layer, ion implantation is carried out thereto. Preferably, the impurity ion such as $As^+$, $P^+$, $B^+$, $BF_2^+$ is implanted with dosage of $1 \times 10^{14}$ cm$^{-2}$ or more. As a result, the polyimide resin layer has a resistivity to etching by the etchant containing hydrazine. This method can be used for preventing generation of unwanted etching in the process of forming the via hole in case of using the polyimide resin as the interlayer insulator for multiwiring structure.

6 Claims, 8 Drawing Figures

METHOD OF MANUFACTURING A SEMICONDUCTOR DEVICE HAVING A LAYER OF POLYMIDE RESIN

BACKGROUND OF THE INVENTION (1) Field of the Invention

This invention relates to a method of manufacturing a semiconductor device using the polyimide resin as the insulating layer.

(2) Description of the Prior Art

A thermosetting polyimide resin is used as a materials for forming an insulating layer in a semiconductor device having the multilayer wiring structure. Application of such polyimide resin into a semiconductor device is disclosed in the U.S. Pat. No. 3,700,497. In case of application of polyimide resin into a semiconductor device, it is the heat resistivity that is excellent as compared with that of other organic thermosetting resins. In addition, the polyimide resin can be etched with excellent reproduceability, particularly by the etching solution of hydrazine system and allows formation of fine patterns. This is a very important advantage for application into a semiconductor device. The etching technique using the eteching solution of hydrazine system is disclosed in the U.S. Pat. No. 4,218,283. In addition to the ordinary polyimide resin obtained by the condensation reaction of the polyamic acid, the polyimideisoindroquinazo-linedione (PIQ) as described in this reference is also referred in this specification as the polyimide resin.

In case the polyimide resion is used as the interlayer insulator of the multilayer wiring structure, it is often required to repeat formation of the polyimide resin layers and patterning by the selective etchings. In such a case, the polyimide layer pattern formed precedingly is desirable to be insoluble for the etching solution in the succeeding etching process for forming the polyimide layer pattern. The etching rate of polyimide can be changed by adjusting the composition of etching solution, but an effective means for changing the etching rate of polyimide resin layer already formed for the particular etching solution have not been known. Particularly, if there is a means for lowering the etching rate of a part of the polyimide resin layer, it is useful for manufacturing of a semiconductor device.

SUMMARY OF THE INVENTION

It is a principal object of the present invention to provide a method of lowering freely the etching rate of the polyimide resin layer for the particular etching solution in the manufacturing process for a semiconductor device having the polyimide resin layer.

It is another object of the present invention to provide a method of lower ing the etching rate of a part of the polyimide resin layer.

It is further object of the present invention to provide a method of protecting, during the formation of the upper polyimide pattern, the lower polyimide pattern already formed from a damage, in the manufacturing process for a semiconductor device having the multilayer wiring structure using the polyimide resin as the interlayer insulator.

A method of manufacturing a semiconductor device of the present invention includes the process for implanting ion species into a part of a polyimide resin layer formed on a substrate, thereby selectively lowering the etching rate of the implanted area of the polyimide resin. There is no particular limitation on the available ion species, but it is convenient to use impurity ions such as arsenic ion, phosphorus ion and boron ion because they are usually used in the field of manufacturing a semiconductor device. An implanting energy can also be determined freely to a value larger than the lower limit causing the sputtering, namely to a value almost equal to 10 keV or more. In order to cause substantial change of etching rate, it is necessary to implant the ion in such a dosage of $1 \times 10^{13}$ cm$^{-2}$ or more, desirable $1 \times 10^{14}$ cm$^{-2}$. As the polyimide resin for which the etching rate is controlled by such ion implantation, there is no particular limitation on the kinds, and any kind of polyimide resin including PIQ disclosed in said prior art reference can be used.

Thus, the etching rate of the polyimide resin layer having received the ion implantation can be lowered to such a degree as it is substantially resistive to the etching solution of the hydrazine system. The ion implantation should be selectively carried out to the desired region of polyimide resin depending on the structure of semiconductor device to be manufactured. In case, the polyimide resin layer patterns of plural levels should be formed on the substrate, the process of forming the upper polyimide resin pattern should be formed after executing the ion implantation into the surface of lower polyimide resin pattern. In some cases, such a process as executing local ion implantation using an adequate masking layer such as a resist layer on a single level polyimide resin layer may be useful, depending on the device structure.

DESCRIPTION OF THE PREFERRED EMBODIMENT

Figure 1:
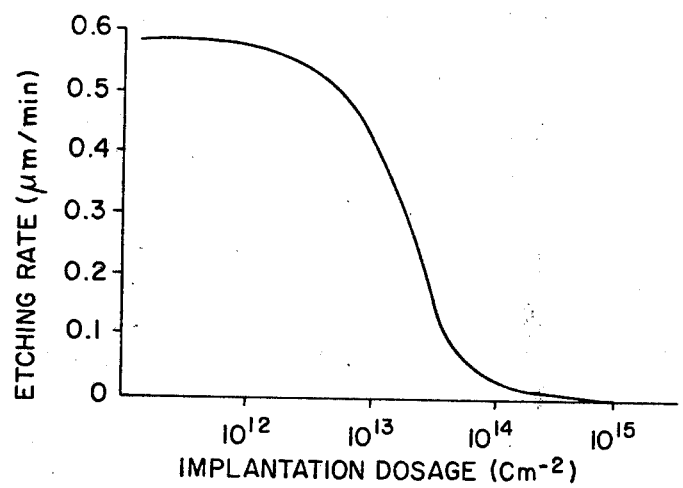
FIG. 1 is the graph showing the relation between the amount of dose for ion implantation and a resultant etching rate of polyimide resin.

FIG. 1 is the graph showing the etching rate of ion implanted polyimide resin layer. The polyimide resin used has been synthesized through the curing process using the polyimide prepolymer consisting of the polyamic acid marketted by the trade name of SP 760 from Toray Kabushikikaisha. The prepolymer solution having concentration of nonvolatile component of 14.6% is coated on the silicon substrate, the preliminary curing is carried out at a temperature of 150° C. and 200° C. in air, thereafter further curing is carried out for 30 minutes under a temperature of 450° C. in the nitrogen ambient and thereby the coated layer is converted into the polyimide resin layer. The, boron difluoride ion (BF$_2$+) has been implanted onto this polyimide resin layer. The implantation energy is 100 KeV and its dose amount is plotted on the horizontal axis in FIG. 1. The etchant used is composed of ethylenediamine of 16 wt% (98% aqueous solution) and the remaining hydrazine hydrate (98% aqueous solution). This solution is kept at 35° C. and the etching has been carried out for the ion implanted polyimide resin layer. The result is shown as the graph of FIG. 1. As is obvious from this graph, when dosage exceeds $1 \times 10^{13}$ cm$^{-2}$, the etching rate of polyimide resin substantially lowers, and when ion implantation is carried out in the dosage of $1 \times 10^{14}$ cm$^{-2}$, the resultant polyimide resin is almost not etched.

In case the ion implantation is carried out using the ion species other than BF$_2$+, change of the etching rate is shown in Table 1. The polyimide resin used and the etching conditions are same as those selected for the experiment of FIG. 1.

TABLE 1

| Ion species | Acceleration energy | Dosage | etching rate |
|---|---|---|---|
| Arsenic(As+) | 180[KeV] | $1 \times 10^{14}$[atm/cm$^2$] | 0.02[μm/min] |
| | | $1 \times 10^{15}$[atm/cm$^2$] | to 0[μm/min] |
| Phosphorus(P+) | 80[KeV] | $1 \times 10^{14}$[atm/cm$^2$] | 0.05[μm/min] |
| | | $1 \times 10^{15}$[atm/cm$^2$] | to 0[μm/min] |
| Boron(B+) | 25[KeV] | $1 \times 10^{14}$[atm/cm$^2$] | 0.3[μm/min] |
| | | $1 \times 10^{15}$[atm/cm$^2$] | to 0[μm/min] |

From above Table 1, it is obvious that the same result can be obtained even when the ion species or the ion implantation energy is changed. Namely, the etching rate has largely changed (lowered) at the dosage of $1 \times 10^{14}$ cm$^{-2}$ and moreover the etching does not substantially proceeds in the polyimide resin implanted with ions at the amount of dose of $1 \times 10^{15}$ cm$^{-2}$ or more. Here, it should be noted that the important characteristics of the polyimide resion for application into a semiconductor device such as heat resistivity and electrical insulation property are not substantially deteriorated at the dosage of about $1 \times 10^{15}$ cm$^{-2}$. Therefore, the above method for controlling the etching rate of polyimide resin layer by the ion implantation can be adapted for manufacture of a semiconductor device.

For example, an embodiment of the process for manufacturing a bipolar type semiconductor device having the multilayer wiring structure by the present invention is explained, upon reference to FIG. 2. First, as shown in FIG. 2A, the substrate obtained by the following step is prepared; namely the base diffusion region 22 and emitter diffusion region 23 etc. are formed through the ordinary process on the semiconductor substrate, for example, in the silicon epitaxial layer 21, while the lower SiO$_2$ insulating film 24 on the silicon epitaxial layer 21 respectively moreover the electrode windows 25 and 26, etc. for the base diffusion region 22, emitter diffusion region 23, are formed on the lower SiO$_2$ insulating film 24, and the lower Al wirings 27a, 27b etc. connected respectively to the base diffusion region 22 and emitter diffusion region 23 etc. in said electrode windows 25 and 26 are formed on said lower SiO$_2$ insulating film 24. Thereafter, as shown in FIG. 2B, the first polyimide layer 28 is formed on said substrate to be processed by the spin coating of the polyamic acid solution and a step curing process in such a thickness as perfectly embedding the lower al wirings 27a and 27b etc.

Figure 2A:
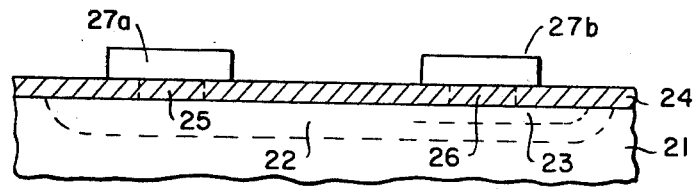
FIG. 2A through FIG. 2G show the sectional structure of substrate in the process for manufacturing a semiconductor device having the multilayer wiring structure according to the embodiment of present invention.
Figure 2B:
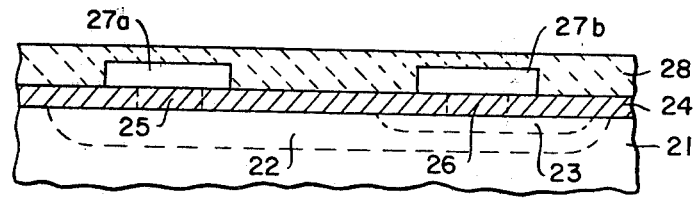
Figure 2C:
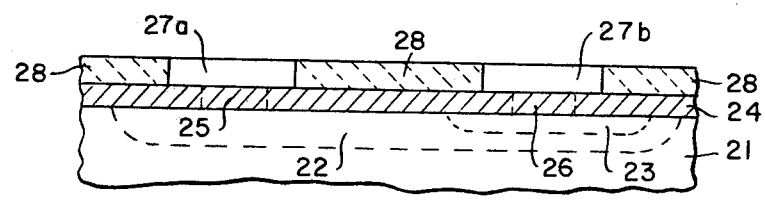
Figure 2D:
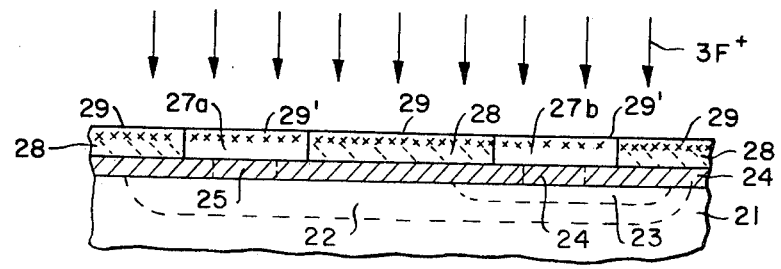
Figure 2E:
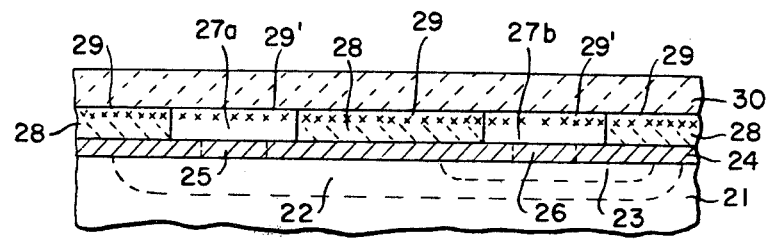
Figure 2F:
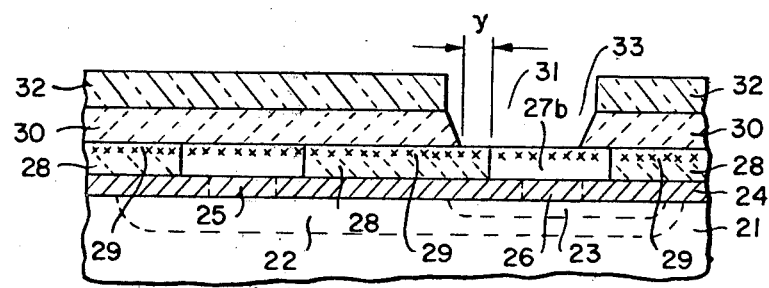
Figure 2G:
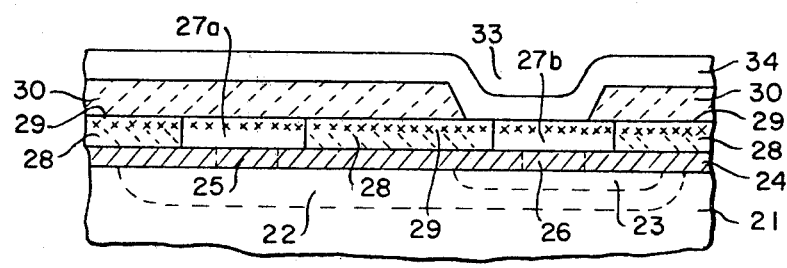

The desirable conditions when the polyamide acid SP 760 (trade name of a product supplied by Toray Kabushikikaisha) employed in the experiment of FIG. 1 is used are as follow. With adjustment of viscosity of the polyamic acid solution to 700 cp, the spin coating is carried out by rotating the substrate at 4000 rpm. As the cure condition, the step curing is carried out for 30 minutes each at 150° C., 200° C. and 450° C. The polyimide layer formed has the thickness of 1.3 μm. Succeedingly, as shown in FIG. 2C, the first polyimide layer 28 is evenly removed from the surface until the upper surface of the lower Al wirings 27a, 27b is perfectly exposed, for example, by the ordinary oxygen (O$_2$) plasma processing. At this time, the dent part having been formed between the lower wirings 27a, 27b is filled in flat by the first polyimide layer 28. Then, the boron difluoride ion (BF$_2$+) in dosage of $1 \times 10^{15}$ cm$^{-2}$ or so is implanted, for example, with acceleration energy of about 100 KeV on the surface of said substrate to be processed and as shown in FIG. 2D, the high concentration implanted region 29 of BF$_2$+ is formed on the surface of the first polyimide layer 28. In this case, a very shallow BF$_2$+ implanted region 29' is also formed at the upper surface of the lower Al wirings 27a, 27b, but it does not cause the quality of wiring surface to be deteriorated. Next, as shown in FIG. 2E, the second polyimide layer 30 is formed in the thickness of about 1 [μm] on the first polyimide layer 28 and upper part of lower Al wirings 27a, 27b etc. through the step curing process similar to that mentioned above by using the same material as that of the first polyimide layer 28 and by executing the spin coating at 4500 rpm. Thereafter, as shown in FIG. 2F, the negative resist film 32 of the rubber system having the etching window 31, for example, for exposing the wiring connection window forming region surface for the desired lower wiring 27b is formed by the ordinary photo process on the second polyimide layer 30. In succession, with said photo resist film 32 used as the mask, the selective etching is carried out for the second polyimide layer 30 by the ordinary wet etching method using the polyimide etching solution consisting of hydrazine solution or the mixed solution of hydrazine and ethylenediamine and thereby the wiring connection window (via hole) 33 exposing the upper surface of the lower Al wiring 27b is formed on said second polyimide layer 30. In this case, as shown in the figure, even if some misalignment occurs between the wiring connection window 33 and the lower Al wiring 27b, the dent part by the over etching is never formed in said region displaced, since the BF$_2$+ high concentration implanted region 29 having very high resistivity to said etching is formed at the upper surface of the first polyimide layer 28 exposed to said region y. Thereafter, as shown in FIG. 2G, the upper wiring, for example, the upper Al wiring 34 which comes contact with the lower Al wiring 27b at the wiring connection window 33 is formed on the second polyimide layer 30 by the ordinary method, namely the means such as vacuum evaporation or sputtering and selective etching etc. In the method of the present invention, no step is generated between the first polyimide layer 28 exposed within the wiring connection window 33 and the upper surface of the lower Al wiring 27b by misalignment between the wiring connection window 33 and the lower Al wiring 27b explained above. Therefore, any defect such as cracks does not occur at the upper Al wiring 34 in the wiring connection window 33.

We claim:

1. A method of manufacturing a semiconductor device comprising the steps of:
    forming on a substrate a polyimide resin layer,
    implanting an ion into a portion of said polyimide resin layer to substantially decrease the etching rate of said portion of said polyimide resin layer, are
    carrying out a selective etching of said polyimide resin layer so that the etching is sbustantially blocked by said portion of said polyimide resin layer.

2. A method as set forth in claim 1, wherein said ion is implanted with dosage of more than $1 \times 10^{13}$ cm$^{-2}$.

3. A method as set forth in claim 1 or 2, wherein said ion is at least one of impurity ions selected from a group consisting of arsenic ion, phosphorus ion, boron ion and boron difluoride ion.

4. A method as set forth in claim 1, wherein said etching is carried out by an etchant containing hydrazine.

5. A method of manufacturing a semiconductor device having a multilayer wiring structure comprising the steps of:

forming on a substrate the first level wiring layer, forming the first polyimide resin layer on said substrate to form an even surface, with at least a part of said first level wiring layer being exposed through said first polyimide layer, implanting an ion onto said first polyimide resin layer to substantially decrease its ething rate, forming the second polyimide resin layer on said implanted first polyimide resin layer and said first level wiring layer, selectively etching said second polyimide resin layer to form a via hole onto a part of said first level wiring layer, and forming on said second polyimide resin layer the second level wiring layer which is connected to said first level wiring layer through said via hole.

6. A method as set forth in claim 5, wherein said first polyimide resin layer forming step comprises the steps of:

forming a polyimide resin coating over said first level wiring layer on said substrate, and removing evenly a surface portion of said polyimide resin coating to expose said first level wiring layer.

* * * * *

UNITED STATES PATENT AND TRADEMARK OFFICE
CERTIFICATE OF CORRECTION

PATENT NO. : 4,394,211

DATED : July 19, 1983

INVENTOR(S) : Uchiyama et al.

It is certified that error appears in the above-identified patent and that said Letters Patent is hereby corrected as shown below:

Front page, [54] Title, line 3, "POLYMIDE" should be --POLYIMIDE--;

After [22], insert the following:

--[30] Foreign Application Priority Data
September 14, 1981 [JP] Japan .......... 56-145320--.

Col. 1, line 32, "resion" should be --resin--;
line 55, "lower ing" should be --lowering--.
Col. 2, line 50, "marketted" should be --marketed--.
Col. 3, line 27, "resion" should be --resin--;
line 55, "al" should be --Al--;
line 57, "polyamide" should be --polyimide--.
Col. 4, line 66, "sbustantially" should be --substantially--.
Col. 5, line 15, "saId" should be --said--.

UNITED STATES PATENT AND TRADEMARK OFFICE
CERTIFICATE OF CORRECTION

PATENT NO. : 4,394,211  
DATED : July 19, 1983  
INVENTOR(S) : Uchiyama et al.

Page 2 of 2

It is certified that error appears in the above-identified patent and that said Letters Patent is hereby corrected as shown below:

```
Col. 4, line 61, "an ion" should be --ions--.
        line 64, "are" should be --and--.
Col. 5, line 1,  "ion" should be --ions--;
        line 2,  "is" should be --are--;
        line 4,  "ion is" should be --ions are--.
Col. 6, line 1,  "an ion" should be --ions--.
```

Signed and Sealed this

Eighth Day of November 1983

[SEAL]

Attest:

Attesting Officer

GERALD J. MOSSINGHOFF

Commissioner of Patents and Trademarks